US010510615B2

United States Patent
Weng et al.

(10) Patent No.: US 10,510,615 B2
(45) Date of Patent: Dec. 17, 2019

(54) FINFET DEVICES AND METHODS OF FORMING THE SAME

(71) Applicant: Taiwan Semiconductor Manufacturing Company, Ltd., Hsin-Chu (TW)

(72) Inventors: Tzu-Chan Weng, Kaohsiung (TW); Wan-Chun Kuan, Hsin-Chu (TW); Yi-Wei Chiu, Kaohsiung (TW); Meng-Je Chuang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 83 days.

(21) Appl. No.: 15/364,038

(22) Filed: Nov. 29, 2016

(65) Prior Publication Data
US 2018/0151446 A1  May 31, 2018

(51) Int. Cl.
| | |
|---|---|
| *H01L 21/8234* | (2006.01) |
| *H01L 21/3105* | (2006.01) |
| *H01L 21/311* | (2006.01) |
| *H01L 21/67* | (2006.01) |
| *H01L 21/762* | (2006.01) |

(52) U.S. Cl.
CPC .......... *H01L 21/823481* (2013.01); *H01L 21/31055* (2013.01); *H01L 21/31116* (2013.01); *H01L 21/67069* (2013.01); *H01L 21/76224* (2013.01); *H01L 21/823431* (2013.01)

(58) Field of Classification Search
None
See application file for complete search history.

(56) References Cited

U.S. PATENT DOCUMENTS

| | | | | |
|---|---|---|---|---|
| 6,004,863 | A * | 12/1999 | Jang | H01L 21/76229 257/E21.245 |
| 2004/0173759 | A1* | 9/2004 | Koops | H01J 37/3056 250/428 |
| 2006/0128158 | A1* | 6/2006 | Sugiura | B81C 1/00476 438/706 |
| 2014/0353795 | A1* | 12/2014 | Tong | H01L 21/76224 257/506 |
| 2016/0093488 | A1* | 3/2016 | Thadani | H01L 21/02126 438/786 |
| 2016/0322462 | A1* | 11/2016 | Chou | H01L 21/30604 |
| 2017/0221769 | A1* | 8/2017 | Park | H01L 21/823814 |

OTHER PUBLICATIONS

J. Ruzyllo et al., "Etching of Thermal Oxides in Low Pressure Anhydrous HF/CH3OH Gas Mixture at Elevated Temeprature," J. Electrochem. Soc., vol. 140, No. 4, Apr. 1993, 3 pages.

* cited by examiner

*Primary Examiner* — Anthony Ho
*Assistant Examiner* — Kevin Quinto
(74) *Attorney, Agent, or Firm* — Slater Matsil, LLP

(57) ABSTRACT

A method of manufacturing a semiconductor device includes forming a semiconductor strip protruding above a substrate, forming isolation regions on opposing sides of the semiconductor strip, recessing the isolation regions in a first chamber using a first etching process, and increasing a planarity of the isolation regions in the first chamber using a second etching process.

20 Claims, 8 Drawing Sheets

FINFET DEVICES AND METHODS OF FORMING THE SAME

BACKGROUND

The semiconductor integrated circuit (IC) industry has experienced rapid growth. Over the course of this growth, functional density of the devices has generally increased while the device feature size or geometry has decreased. This scaling down process generally provides benefits by increasing production efficiency, lowering costs, and/or improving performance. Such scaling down has also increased the complexities of processing and manufacturing ICs and, for these advances to be realized similar developments in IC fabrication are needed.

Likewise, the demand for increased performance and shrinking geometry from ICs has brought the introduction of multi-gate devices. These multi-gate devices include multi-gate fin-type transistors, also referred to as fin field-effect transistor (FinFET) devices, because the channel is formed on a "fin" that extends from the substrate. FinFET devices may allow for shrinking the gate width of device while providing a gate on the sides and/or top of the fin including the channel region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
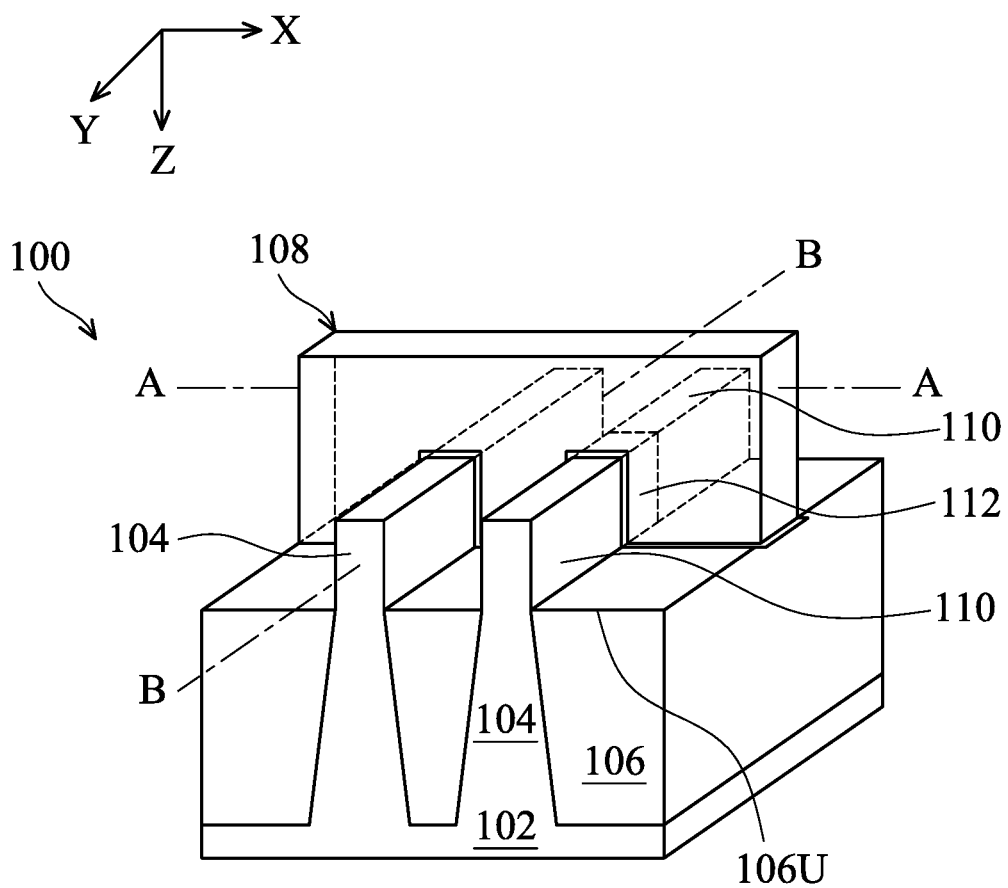
FIG. 1 illustrates a perspective view of a FinFET device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a perspective view of a semiconductor device 100. Semiconductor device 100 includes FinFET type device(s), as illustrated in FIG. 1. Semiconductor device 100 may be an n-type FinFET or a p-type FinFET, and may be included in an IC such as a microprocessor, a memory device, a logic device, and/or other ICs. As illustrated in FIG. 1, semiconductor device 100 includes a substrate 102, a plurality of fins 104 protruding over substrate 102, a plurality of isolation structures 106 between and around fins 104, and a gate structure 108 disposed over fins 104. Each of the fins 104 includes source/drain regions 110 where a source or drain feature is formed in, on, and/or surrounding fin 104. A channel region 112 of fin 104 underlies gate structure 108.

Substrate 102 may be a silicon substrate. Alternatively, substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, substrate 102 is a semiconductor on insulator (SOI) substrate.

Isolation structures 106 may be formed of silicon oxide, silicon nitride, silicon oxynitride, fluoride-doped silicate glass (FSG), a low-k dielectric material, and/or other suitable insulating material. Isolation structures 106 may be shallow trench isolation (STI) features. In an embodiment, isolation structures 106 are STI features and are formed by etching trenches in substrate 102 and filling the trenches with isolating material(s). Isolation structures 106 may include a multi-layer structure, for example, having one or more liner layers. As an example, insolation structures 106 may include a thermal oxide liner layer, with silicon oxide or silicon nitride formed over the thermal oxide liner layer.

Fin structures 104 may provide an active region where one or more devices are formed. In FIG. 1, the upper portions of structures 104 extending above an upper surface 106U of isolation structures 106 are referred to as fins 104, and the lower portions of structures 104 below the upper surface 106U are referred to as semiconductor strips 104, or strips 104. Similar nomenclature is used throughout the disclosure. Fins 104 comprises a same material as substrate 102, in some embodiments. In other embodiments, fins 104 comprises a different material than substrate 102. For example, fins 104 may be formed by recessing top portions of semiconductor strips 104, then epitaxially growing a semiconductor material different from the material of semiconductor strip 104 over semiconductor strip 104 to form fins 104. Fin 104 may be doped using n-type and/or p-type dopants. A channel region 112 may be formed in each fin 104 underneath gate structure 108, and source/drain regions 110 may be formed in/on fin 104 on opposing sides of gate structure 108.

Gate structure 108 may include a gate dielectric layer, a work function layer, and/or one or more additional layers. In an embodiment, gate structure 108 includes a silicide layer. The silicide layer may overlie the gate dielectric layer and/or the work function layer.

Semiconductor device 100 may include other layers and/or features not specifically illustrated including additional source/drain regions, interlayer dielectric (ILD) layers, contacts, interconnects, and/or other suitable features. Although FIG. 1 illustrates two fins 104 and one gate structure 108, skilled artisans will appreciate that other numbers of fins and other numbers of gate structures are possible and are fully intended to be included within the scope of the present disclosure. For example, FIGS. 2A-3B and 6A-7B illustrate a semiconductor device 300 with four fins 310 and three gate structures 410.

As shown in FIG. 1, three directions X, Y and Z are defined. A direction X is parallel to the longitudinal direction of gate structures 108. A direction Y is perpendicular to direction X, and is along a longitudinal direction of fins 104. A direction Z is perpendicular to both X and Y directions, along the vertical direction of gate structures 108.

Referring to FIGS. 2A-3B, and 6A-7B, illustrated are various cross-sectional views of a FinFET semiconductor device 300 at various stages of fabrication according to embodiments of the present disclosure. In FIGS. 2A-3B, and 6A-7B, a figure with letter "A" in its number illustrates a cross-sectional view of semiconductor device 300 at various stages of fabrication along a line A-A (see FIG. 1), where line A-A is inside a gate structure (see 108 in FIG. 1) and parallel to direction X; and a figure with letter "B" in its number illustrates a cross-sectional view of semiconductor device 300 at various stages of fabrication along a line B-B (see FIG. 1), where line B-B is inside a fin (see 104 in FIG. 1) and parallel to direction Y.

Figure 2A:
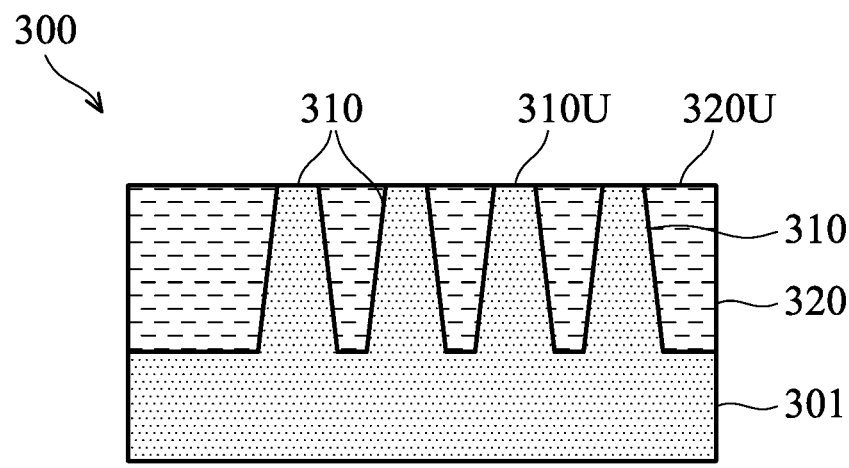
FIGS. 2A-3B illustrate cross-sectional views of a FinFET device at various stages of fabrication, in accordance with some embodiments.
Figure 2B:
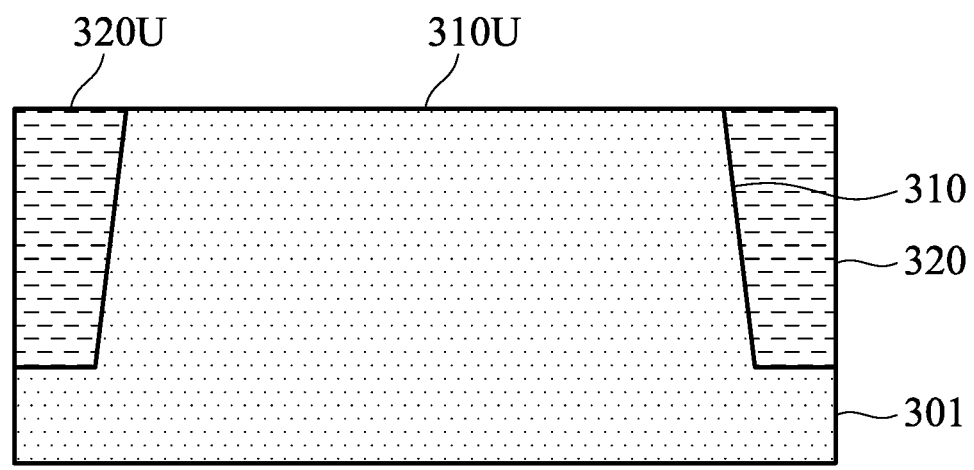

FIGS. 2A and 2B illustrate two cross-sectional views of a FinFET semiconductor device 300 having a substrate 301 at one of various stages of fabrication according to embodiments of the present disclosure. As shown in FIGS. 2A and 2B, semiconductor strips 310 are formed extending above substrate 301. Material of substrate 301 may be the same as substrate 102 in FIG. 1, thus are not repeated here. In some embodiments, semiconductor strips 310 are formed in substrate 301 by etching trenches in substrate 301. The etching may be any suitable etch process, such as a photolithography process and an etching process. The photolithography process may include forming a photoresist layer (also referred to as resist, not shown) overlying the substrate 301, exposing the resist to a pattern, performing post-exposure bake processes, and developing the resist to form a masking element including the resist. The masking element may then be used to protect regions of the substrate while an etch process forms a recesses into the substrate, leaving semiconductor strip 310 extending above substrate 301. The etching process may use etchant such as HF or other suitable etchant. In addition, other etching processes, such as reactive ion etch (RIE), neutral beam etch (NBE), the like, or a combination thereof, may also be used to form semiconductor strips 310. The etching may be anisotropic.

As shown in FIGS. 2A and 2B, an insulation material is formed around and between semiconductor strips 310 to form isolation structures 320. The insulation material may be an oxide such as silicon oxide, silicon nitride, silicon oxynitride, other suitable materials, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In some embodiments, isolation structure 320 may have a multi-layer structure such as a thermal oxide liner layer filled with silicon nitride or silicon oxide. After being formed, isolation structure 320 may extend over upper surfaces 310U of semiconductor strips 310. A planarization process, such as a chemical mechanical planarization (CMP) process, may be used to remove excess amount of insulation material (e.g., portions of 320 above upper surfaces 310U of semiconductor strips 310), and to achieve a substantially level upper surface 320U for isolation structure 320 and to expose upper surfaces 310U of semiconductor strips 310.

Other methods for forming semiconductor strips 310 and isolation structures 320 are possible. For example, insulation material 320 may be deposited over substrate 301 and patterned to form trenches that expose areas of substrate 301, and an etching process may be performed next to remove top portions of substrate 301 in the exposed areas, and a subsequent epitaxial growth process may be performed to form semiconductor strips 310, which may include a semiconductor material different from the material of substrate 301.

As semiconductor process technology advances beyond sub-20 nm node, reduced feature size poses more challenges for semiconductor manufacturing. For example, referring to FIG. 5, for an advanced process technology, the pitch P between two semiconductor fins 310 may be smaller than 20 nm, and the width W at the top of fins 310 may be smaller than 5 nm, and an aspect ratio (ratio of fin height H to fin width W) of fin 310 may be 7 or larger. Conventional deposition methods may not perform well for forming isolation structures 320 in trenches (e.g., spaces between neighboring fins or strips) with high aspect ratios. Flowable CVD (FCVD) has gained popularity due to its ability to fill the gap of not only high aspect ratio (e.g., aspect ratios of 7:1 or more) straight vertical trenches, but also the ability to fill small horizontal trenches. FCVD process forms flowable dielectric films which, as their name suggest, can flow to fill voids in a gap. Usually, various chemistries are added to the precursors to allow the deposited film to flow. In some examples, nitrogen hydride bonds are added. After the flowable film is deposited, it may be cured and then annealed to remove the added chemistry to form silicon oxide.

Referring back to FIGS. 2A and 2B, in some embodiments, isolation structures 320 are formed by an FCVD process. In the FCVD process, a first silicon-containing precursor is introduced into a deposition chamber with semiconductor device 300 present. In some embodiments, the silicon-containing precursor is a silylamine, such as trisilylamine (TSA), disilylamine (DSA), or a combination thereof. One or more carrier gases may also be included with the silicon-containing precursor. The carrier gases may include helium (He), argon (Ar), nitrogen ($N_2$), the like, or a combination thereof. Next, a second precursor is provided to the deposition chamber. In some embodiments, the second precursor is a nitrogen-containing precursor. The nitrogen-containing precursor may include $NH_3$, $N_2$, the like, or a combination thereof. In some embodiments, the nitrogen-containing precursor is activated into plasma in a remote plasma system (RPS) outside of the deposition chamber. An oxygen source gas, such as $O_2$ or the like may be included with the nitrogen-containing precursor and activated into plasma in the RPS. Plasma generated in the RPS is carried into the deposition chamber by a carrier gas, which includes He, Ar, $N_2$, the like, or a combination thereof, in some embodiments.

In the deposition chamber, the silicon-containing precursor and the nitrogen-containing precursor mix and react to deposit a film containing silicon and nitrogen on substrate 301. In some embodiments, the deposited film has flowable characteristics. The flowable nature of the formation allows the film to flow into narrow gaps, trenches, and other structures on the deposition surface of substrate 301. The deposited film is cured by, e.g., an anneal process. In some embodiments, the anneal process is performed at a temperature between about 500° C. to about 600° C. The anneal process may include one or more anneal steps performed in series, for example. The deposited film turns into oxide (e.g., silicon oxide) after the anneal steps, in various embodiments.

Figure 3A:
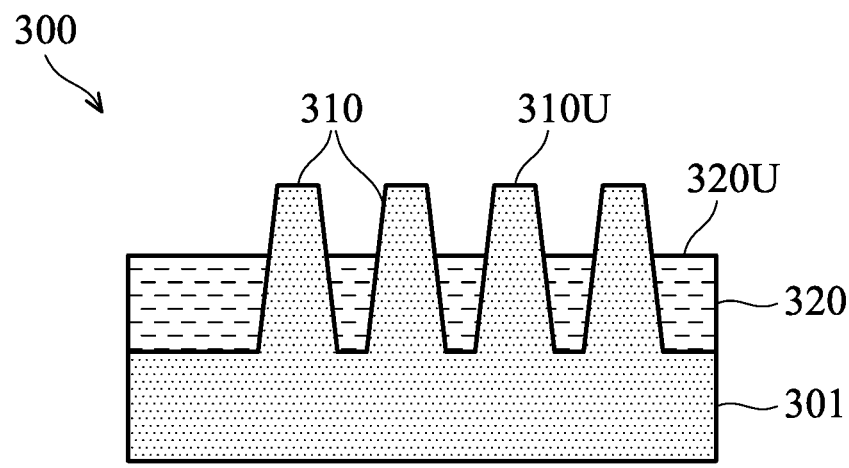
Figure 3B:
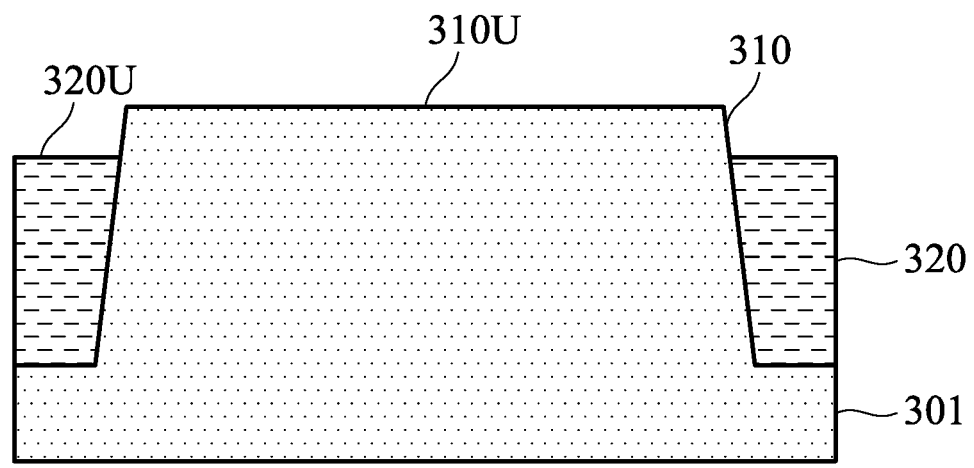

Next, referring to FIGS. 3A and 3B, isolation structures 320 are recessed, e.g., by an etching process, to remove its upper portions, such that upper surface 320U of isolation structures 320 is lower than upper surface 310U of semiconductor strips 310 after the etching process. After the recessing, the upper portions of strips 310 extending above upper surface 320U of isolation structures 320 are referred to as fins 310, and the lower portions of strips 310 below the upper surface 320U are referred to semiconductor strips 310. The remaining portions of isolation structures 320 form shallow trench isolations (STI) structures 320, in some embodiments. Details regarding the etching process (e.g., a first etching process followed by a second etching process, both performed in a same chamber, with a gas purging process between the first and the second etching processes) used to recess isolation structure 320 are discussed below with reference to FIGS. 4 and 5.

Figure 4:
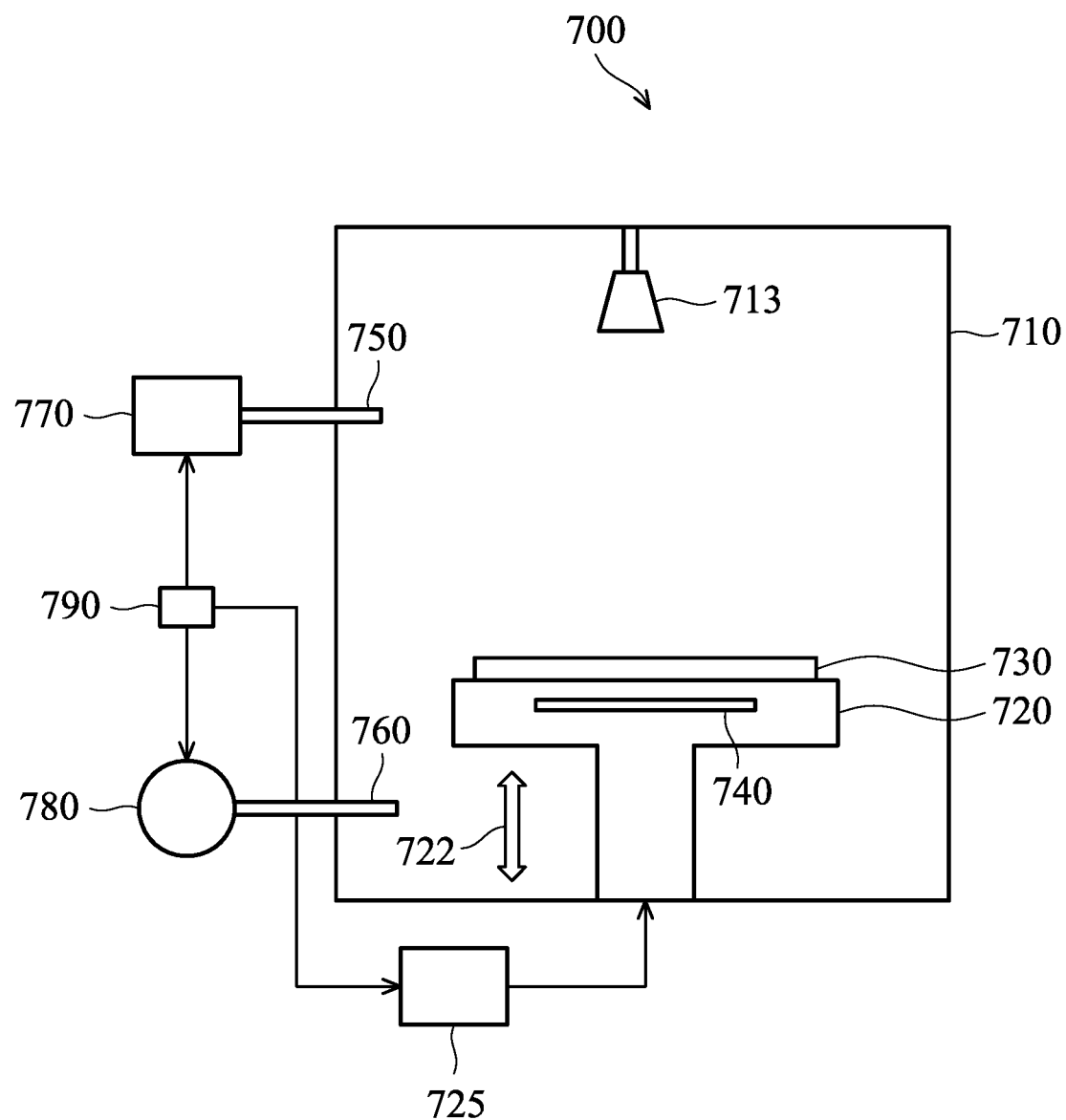
FIG. 4 illustrates an etching system, in accordance with some embodiments.

FIG. 4 illustrates an etching system 700 in accordance with an embodiment of the present disclosure. As illustrated in FIG. 4, an etching system includes a chamber 710, a support 720 and a shower head 713. Support 720 is configured to support a wafer 730 on the top surface of support 720. Wafer 730 may be held in place on support 720 by, e.g., clamps, or suctions created by vacuum holes (not shown) on the top surface of support 720. Wafer 730 may include a plurality of IC devices, such as semiconductor devices 300 at certain stage of the fabrication process. For example, wafer 730, when initially loaded onto support 720, may include a plurality of semiconductor devices 300 at the stage shown in FIGS. 2A and 2B, thus isolation structures 320 are formed over substrate 301 and are ready to be recessed by an etching process to form fins 310 and STI 320 illustrated in FIGS. 3A and 3B. Therefore, chamber 720 servers as the etching chamber to perform the etching process to recess isolation structure 320 to form semiconductor devices 300 shown in FIGS. 3A and 3B.

Referring to FIG. 4, support 720 may include a temperature control unit 740, which may be a heating unit 740, such as an electrical heating unit to heat wafer 730 to a desired temperature during processing, in some embodiments. Temperature control unit 740 may include a cooling unit 740, which may be coupled to a supply of cool air or cool water for cooling wafer 730 to a desired temperature during processing, in some embodiments. Support 720 may be electrically and/or mechanically coupled to a drive system 725, which may be a motor drive system 725, such that support 720 may move up (e.g., toward shower head 713) or down (e.g., away from shower head 713) along the direction indicated by arrow 722. Drive system 725 may be controlled by a control unit 790. Shower head 713 is connected to a gas supply (not shown) and configured to supply a hot gas (e.g., inert gas) into chamber 710, details of which will be discussed hereinafter.

Still referring to FIG. 4, etching system 700 includes an inlet 750 coupled to a gas supply 770. Although only one inlet 750 is illustrated in FIG. 4, two more gas inlets 750 may be used, e.g., for even distribution of gases into chamber 710. Gas supply 770 supplies reactant gases into chamber 710, in some embodiments. Gas supply 770 may include one or more sub-modules for storing and supplying different reactant gases (e.g., etching gases) into chamber 710 at per-determined time. Gas supply 770 is controlled by control unit 790, which controls, e.g., the type of gases, the flow rate of each gas, the start time and stop time for supplying each gas, in some embodiments.

As illustrated in FIG. 4, etching system also includes an outlet 760, which is coupled to a pump 780. Pump 780 is controlled by control unit 790, in some embodiments. For example, control unit 790 may turn on pump 780 to pump out air or gases in chamber 710. Chamber 710 forms an enclosed space during processing, and pump 780 removes air or gases out of chamber 710 to maintain a desired pressure level, in some embodiments. Although one outlet 760 is shown in FIG. 4, two or more outlets 760 may be used in etching system 700, and the outlets 760 may or may not be pumping out air or gases simultaneously.

FIG. 4 is merely a simplified example, skilled artisans will appreciate many variations. For example, FIG. 4 shows inlet 750 is closer to shower head 713 and outlet 760 is farther away from shower head 713. In other embodiments, locations of inlet 750 and 760 are reversed such that outlet 760 is closer to shower head 713 and inlet 750 is farther away from shower head 713. As another example, the shape of chamber 710 may have different shapes, for example, cylindrical, conical or other suitable shapes. Skilled artisan will also appreciate that not all components of an etching system are illustrated in FIG. 4. For example, a loading unit for loading and unloading wafer 730 is not illustrated in FIG. 4. The gas supply 770 may include a mixer (not shown) for mixing different reactant gases and a pump (not shown) for pumping gases into chamber 710, as another example.

Figure 5:
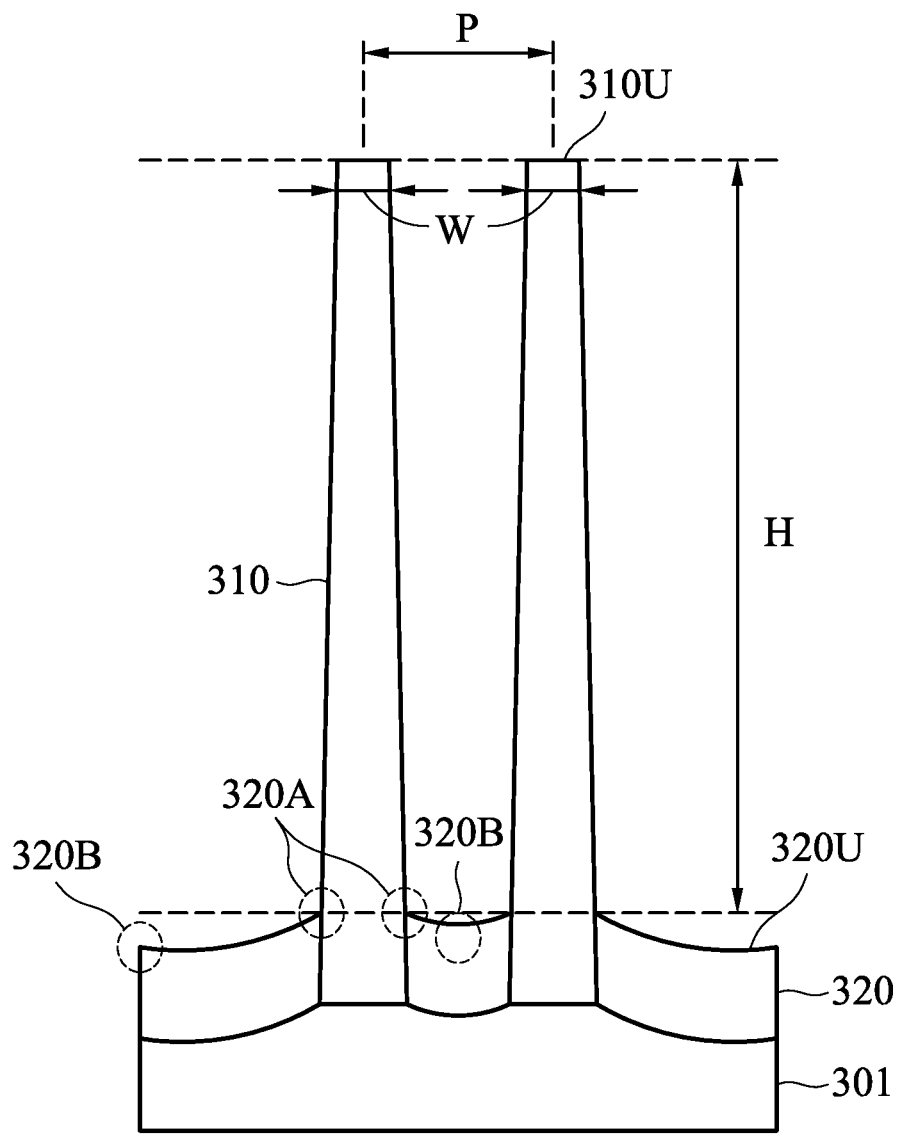
FIG. 5 illustrates a detailed view of the fins and the isolation structures of a FinFET device, in accordance with some embodiments.

Methods for performing an etching process to recess isolation structures 320 illustrated in FIGS. 2A and 2B are discussed herein with reference to FIGS. 4 and 5. In some embodiments, the etching process includes a first etching process followed by a second etching process, with both the first etching process and the second etching process being performed in chamber 710, and a gas purging process between the first etching process and the second etching process. In the discussion herein, an etching gas may refer to a mixture of different gases. In accordance with an embodiment, the first etching process is performed by supplying an etching gas comprising $NH_3$ and HF into chamber 710 via, e.g., inlet 750. The first etching process is performed with a flow rate for NH3 between about 50 standard cubic centimeters per minute (sccm) and about 600 sccm, a flow rate for HF between 50 sccm and about 700 sccm, and at a temperature between about 90° C. and about 150° C., in some embodiments. The pressure of chamber 710 is maintained between 1 torr and about 3 torr in the first etching process, in some embodiments. The etching gases $NH_3$ and HF react with the material (e.g., silicon oxide) of isolation structures 320 to remove upper portions of isolation structure 320. After the first etching process, upper portions of semiconductor strips 310 extend above upper surface 320U of isolation structure 320 and form fins 310.

FIG. 5 illustrates a detailed cross-sectional view showing two fins 310 with isolation structures 320 around them, after the first recess process described above. As illustrated in FIG. 5, upper surface 320U of isolation structures 320 is not planar. In particular, regions 320A of isolation structures, which regions 320A are surface regions contacting fins 310, extend further away from substrate 301 than regions 320B, which are surface regions of isolation structure 320 midway between neighboring fins 310 or surface regions of isolation structure 320 away from regions 320A. In the example of FIG. 5, the upper surface 320U of isolation structures 320 between the two fins 310 resembles a smiling face, due to the lower middle portion (e.g., portion 320B midway between fins 310) and higher edge portions (e.g., portions 320A contacting fins 310). The shape of the non-planar upper surface 320U as shown in FIG. 5 is sometimes referred to as the dishing effect of the etching process of isolations structures 320. Since fin height H is defined as the distance between the upper surface 310U of a fin 310 and the corresponding highest portion (e.g., the edge portion 320A contacting fin 310) of upper surface 320U of isolation structure 320, the dishing effect reduces effective fin height. The dishing effect also results in increased device capacitance, which, together with reduced fin height, may result in lower performance of the semiconductor device and lower wafer acceptance test (WAT) results. Therefore, it may be advantageous to develop etching processes that reduce the dishing effect.

In accordance with some embodiments, after the first etching process, a gas purging process is performed. Referring to FIG. 4, in the gas purging process, gases (e.g., remaining reactant gases and byproducts of chemical reactions after the first etching process) and/or air inside chamber 710 is pumped out via, e.g., outlet 760 by pump 780. The gas purging process (e.g., process to pump out gases and/or air) is performed for about 5 seconds to about 15 seconds until a pre-determined level of vacuum is achieved inside chamber 710, in some embodiments. The pressure inside chamber 710 after the gas purging process is finished may be between 0 torr and about 2 torr, depending on, e.g., whether the etching gas used in a second etching process (see description below) is supplied to chamber 710 while the gas purging processed is performed.

Next, after the gas purging process, a second etching process for wafer 730 is performed in chamber 710. The second etching process includes an etching step and a water removal step, in some embodiments. In the etching step of the second etching process, an etching gas comprising HF and an anhydrous reactant gas, denoted by M, is supplied into chamber 710 and over wafer 730. The anhydrous reactant gas M is a material with low vapor pressure and low surface tension. For example, the anhydrous reactant gas M may be an alcohol (e.g., $C_nH_{2n+1}OH$), such as $CH_3OH$ or $C_2H_5OH$. Chemical equations (1) and (2) below describe the chemical reactions for the etching step, in various embodiments.

$$2HF + M \rightarrow HF_2^- + MH^+ \quad (1)$$

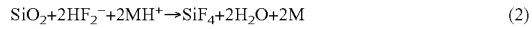

$$SiO_2 + 2HF_2^- + 2MH^+ \rightarrow SiF_4 + 2H_2O + 2M \quad (2)$$

Chemical equations (1) and (2) show that the oxide (e.g., silicon oxide) of isolation structure 320 is consumed by the chemical reactions, and gaseous $SiF_4$ is formed, which may be removed from chamber 710 easily by, e.g., pump 780. The etching step of the second etching process is performed at a temperature between about 10° C. to about 20° C., in the exemplary embodiment. A pressure of the second etching process (e.g., etching step and water removal step) may be maintained between about 1.5 torr and about 2 torr. For example, controller 790 may control pump 780 to maintain a desired level of pressure inside chamber 710. In some embodiments, the etching step of the second etching process is performed with a flow rate of HF between about 50 sccm and about 550 sccm, and a flow rate of M (e.g., $CH_3OH$) between about 10 sccm and about 700 sccm.

The etching gas of the etching step is effective in reducing the dishing effect by, e.g., etching away surface regions of isolation structures 320 next to and/or contacting fins 310 (e.g., region 320A in FIG. 5). In accordance with some embodiments, reducing the dishing effect reduces the distance between surface regions (e.g., 320A) of isolation structures contacting fins 310 and corresponding surface regions (e.g., 320B) of isolation structures midway between neighboring fins 310, where the distance is measured along a direction perpendicular to a major surface of substrate 301 (e.g., along direction Z in FIG. 1). Without being limited to a particular theory of operation, it is believed that regions 320A comprise dense thermal oxide that is harder than the oxide in other regions (e.g., regions 320B), therefore, etching rate for region 320A using etchant $NH_3$ and HF (e.g., in the first etching process) is slower than the etching rate for other regions (e.g., regions 320B). The etchant HF and M (e.g., $CH_3OH$) used in the second etching process provides $HF_2^-$ radicals during the chemical reactions (see chemical equations (1) and (2)), and the etch selectivity (e.g., difference in etch rate) of $HF_2^-$ radicals between the oxide in regions 320A and the oxide in other regions (e.g., regions 320B) is low. Therefore, oxide in regions 320A is removed by the chemical reactions described by equations (1) and (2), thus reducing the dishing effect. Consequently, the planarity of isolation structures 320 is increased by the second etching process in the currently illustrated embodiment. In some embodiments, the distance between surface regions (e.g., 320A) of isolation structures contacting fins 310 and corresponding surface regions (e.g., 320B) of isolation structures midway between neighboring fins 310, measured along fin height direction H, is reduced by 2 nm or more by the embodiment method, thus increasing the planarity of isolation structure 320.

Note that water ($H_2O$) is formed during the chemical reactions (see chemical equation (2)) of the etch step of the second etching process. Removing water from semiconductor device 300 (e.g., wafer 730) may advantageously help to move the chemical reactions (e.g., chemical reaction in equation (2)) toward the right hand side of chemical equations (2). In accordance with an embodiment of the present disclosure, the second etching process further includes a water removal step. Referring to FIG. 4, in the water removal step, support 720 with wafer 730 disposed thereon is raised toward shower head 713 by, e.g., drive system 725. The raising and lowering of support 720 by driver system 725 may be controlled by control unit 790. In the water removal step, shower head 713 supplies a hot gas into chamber 710 and over wafer 730 to evaporate water formed in the etching step, in some embodiments. The hot gas includes inert gas such as Ar, He, $N_2$, the like, or combinations thereof, in some embodiments. A temperature of the inert gas is high enough to evaporate water, in the currently illustrated embodiment. For example, a temperature of the inert gas may be between about 120° C. and about 190° C. During the water removal step, the etching step may continue (e.g., simultaneously with the water removal step), due to the existence of etching gas HF and M in chamber 710. However, due to the high temperature (about 120° C. to about 190° C.) of the inert gas, the chemical reaction of the etching step described in chemical reaction equations (1) and (2) may slow down considerably or stop.

After the water removal step is finished (e.g., performed for a pre-determined period of time), support 720 with wafer 730 disposed thereon is lowered to its original position, shower head 713 stops supplying the hot gas, and the etching step continues at the lower temperature (e.g., between 10° C. and about 20° C.), in some embodiments. Depending on the total length (e.g., time required) of the second etching process, the water removal step may be performed multiple times throughout the second etching process.

In some embodiments, a total time of etching process, which includes the first etching process and the second etching process, is between about 100 seconds and about 200 seconds. The second etching process may comprise about ½ of the total time. The total time of etching process may be adjusted due to a variety of factors, such as design requirements and target fin height (e.g., desired fin height). The duration of the gas purging process is about 0.5 times to about 1.5 times of the total time of the etching process, in accordance with an embodiment. In some embodiments, an average etch rate is between about 0.23 nm/minute to about 0.5 nm/min. The average etch rate may refer to the total amount (e.g., thickness measured along the fin height direction) of oxide removed divided by the total time of the etching process (e.g., the first etching process and the second etching process).

The etching method discussed in the present disclosure with reference to FIGS. 4 and 5 effectively reduces the dishing effect and may result in semiconductor devices having lower capacitance, more effective fin height, and better WAT test results. In addition, since wafer 730 stays in chamber 710 for the first etching process and the second etching process, no time is wasted for transferring wafer between different etch chambers, thus simplifying the etching process and improving the throughput of the semiconductor fabrication process.

Figure 6A:
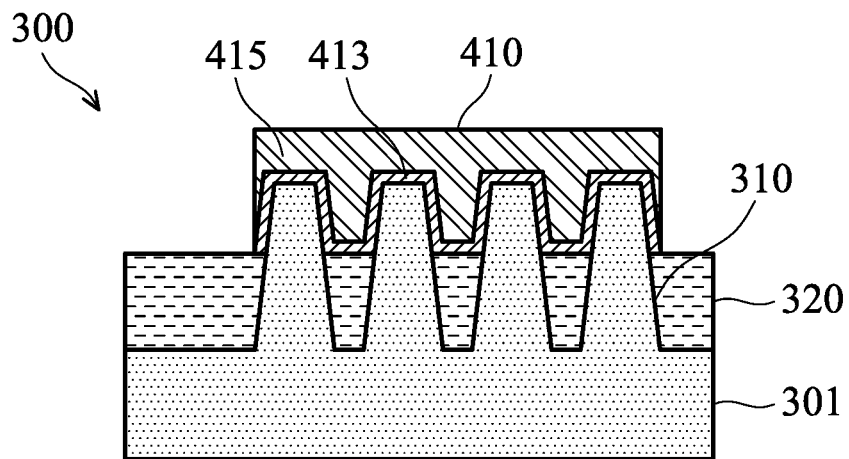
FIGS. 6A-7B illustrate cross-sectional views of the FinFET device shown in FIGS. 2A-3B at various stages of fabrication, in accordance with some embodiments.
Figure 6B:
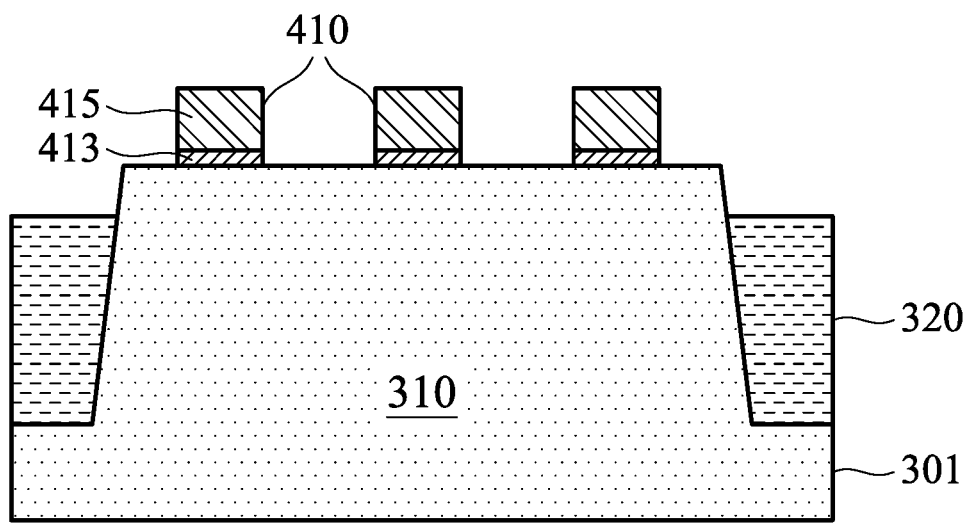

Referring to FIGS. 6A and 6B, gate structure 410 (also referred to as gate stacks 410) are formed over fins 310 and STI structures 320. Gate structure 410 are formed such that the longitudinal direction of gate structure 410 is parallel with the direction of the width of each fin 310 as shown in FIG. 6A, and the direction of the width of each gate structure 410 is in parallel with the longitudinal direction of each fin 310, as shown in FIG. 6B, in embodiments of the present disclosure. In some embodiments, gate structure 410 is a polysilicon gate and includes a gate dielectric layer 413 and polysilicon layer 415 formed over the gate dielectric layer. In other embodiments, gate structure 410 is a metal gate structure including a gate dielectric layer 413 and conductive metal layer(s) 415 over the gate dielectric layer. In yet some other embodiments, gate structure 410 is a sacrificial gate structure (also referred to as dummy gate) such as formed in a replacement gate process used to form a metal gate structure.

Gate dielectric layer 413 of gate structure 410 is formed over the upper surface and sidewalls of fins 310, and over upper surface of STI structures 320, in some embodiments. Gate dielectric layer 413 may include silicon oxide. The silicon oxide may be formed by suitable oxidation and/or deposition methods. Alternatively, the gate dielectric layer 413 of gate structure 410 may include a high-k dielectric layer such as hafnium oxide ($HfO_2$). The high-k dielectric layer may optionally include other high-k dielectrics, such as $TiO_2$, $HfZrO$, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods.

In an embodiment, gate structure 410 may be a metal gate structure. The metal gate structure may include interfacial layer(s), gate dielectric layer(s), work function layer(s), silicide layers as described below, fill metal layer(s), and/or other suitable materials for a metal gate structure. In other embodiments, metal gate structure 410 may further include capping layers, etch stop layers, and/or other suitable materials. The interfacial layer may include a dielectric material such as silicon oxide layer ($SiO_2$) or silicon oxynitride (SiON). The interfacial dielectric layer may be formed by chemical oxidation, thermal oxidation, atomic layer deposition (ALD), CVD, and/or other suitable dielectric.

Exemplary p-type work function metals that may be included in the gate structure 410 include TiN, TaN, Ru, Mo, Al, WN, $ZrSi_2$, $MoSi_2$, $TaSi_2$, $NiSi_2$, other suitable p-type work function materials, or combinations thereof. Exemplary n-type work function metals that may be included in gate structure 410 include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The work function layer(s) may be deposited by CVD, PVD, and/or other suitable process. The fill metal layer may include Al, W, or Cu and/or other suitable materials. The fill metal may be formed by CVD, PVD, plating, and/or other suitable processes. The fill metal may be deposited over the work function metal layer(s). A silicide layer may interpose the work function layer and the fill metal.

It should be noted that the number of polysilicon stacks 410 is not limited by the semiconductor structure shown in FIGS. 6A and 6B and can include more or less than that depicted in FIGS. 6A and 6B. In embodiments of the present disclosure, gate structures 410 may be simultaneously formed, such that each gate structure 410 may comprise the same materials or layers.

Figure 7A:
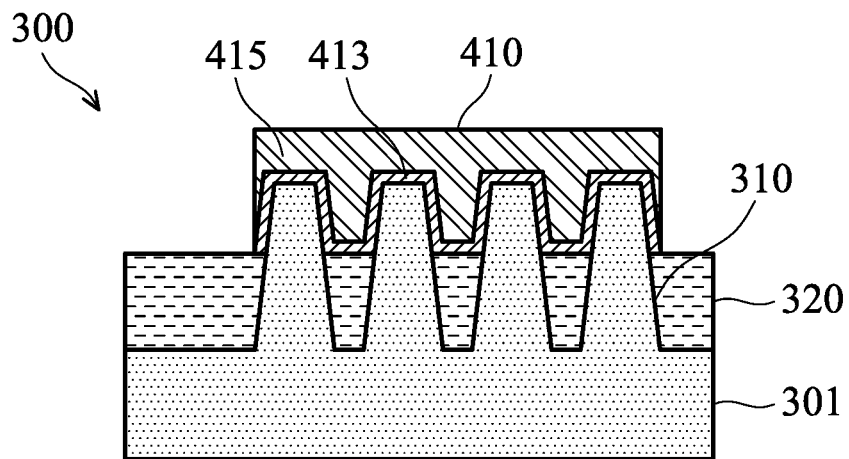
Figure 7B:
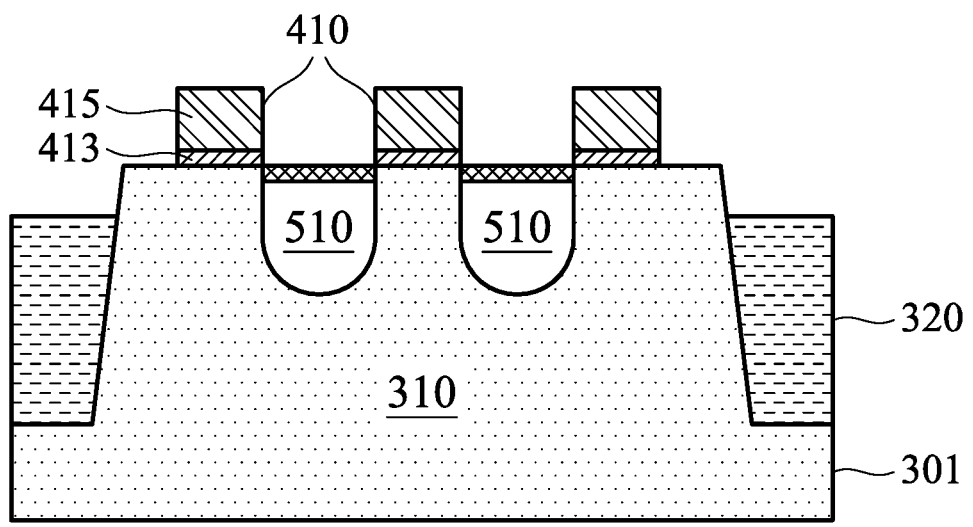

Referring to FIGS. 7A and 7B, source/drain regions 510 are formed on opposite sides of at least one gate stack 410 according to embodiments of the present disclosure. In embodiments of the present disclosure, source/drain regions 510 may be epitaxy regions formed within fins 310. In embodiments of the present disclosure, source/drain regions 510 may be silicon epitaxy regions. In some embodiments, source/drain regions 510 may be silicon germanium epitaxy regions. However, numerous other embodiments of epitaxially grown materials are possible such as, silicon, silicon germanium, silicon carbide, germanium, gallium arsenide, indium phosphide, and/or other suitable materials.

In embodiments of the present disclosure, a spacer layer (not shown) may be deposited over sidewalls of polysilicon stacks 410 to define source/drain regions 510 on fins 310. After spacer layer is deposited, an epitaxy (epi) process is performed to form source/drain regions 510 within fins 310. Semiconductor device 300 may benefit in performance from a stress provided on fins 310 in the channel region. In an embodiment, a tensile strain may be generated. In another embodiment, a compressive strain may be generated. Various methods are available to induce strain in the channel region, details are not repeated here.

In a replacement gate process, gate stack 410 is a dummy gate structure that will be replacement by, e.g., a metal gate. The replacement gate process further includes forming interlayer dielectric (ILD) layers over dummy gate stack 410 and STI structures 320, removing dummy gate stack 410 to form trenches, forming gate dielectric layer along surfaces of the trenches, and filling the trenches with metal layer(s), in various embodiments.

FIGS. 2A-7B are examples used to illustrate various embodiments of the present disclosure. Further IC manufacturing processes are needed to form various features of an IC chip known in the art. Exemplary processes that may be performed include the formation of contact features coupled to the gate structure, and a multi-layer interconnect (MLI) having via and interconnect lines that may interconnect one or more semiconductor devices formed on the substrate.

Figure 8:
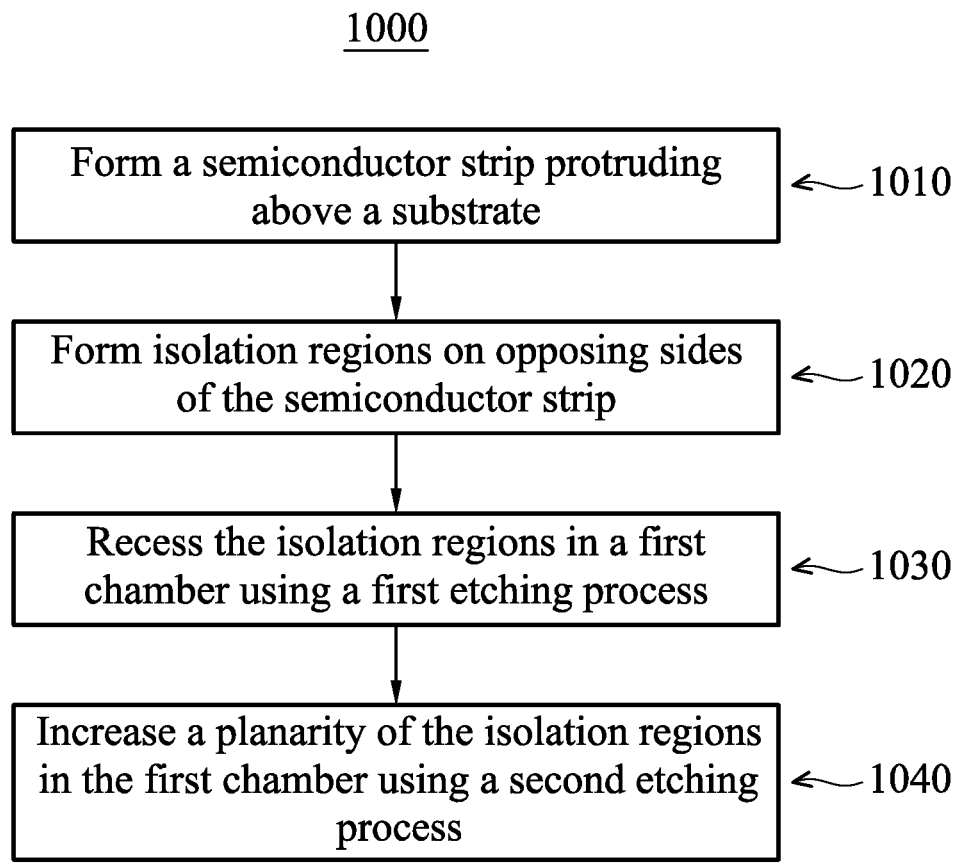
FIG. 8 illustrates a flow chart of a method of manufacturing a semiconductor device, in accordance with some embodiments.

FIG. 8 illustrates a flow chart of a method for forming a semiconductor device, in accordance with various embodiments of the present disclosure. The flowchart shown in FIG. 8 is merely an example, which should not unduly limit the scope of the claims. One of ordinary skill in the art would recognize many variations, alternatives, and modifications. For example, various steps as illustrated in FIG. 8 may be added, removed, replaced, rearranged and repeated.

Referring to FIG. 8, at step 1010, a semiconductor strip is formed protruding above a substrate. At step 1020, isolation regions are formed on opposing sides of the semiconductor strip. A step 1030, the isolation regions are recessed in a first chamber using a first etching process. At step 1040, a planarity of the isolation regions is increased in the first chamber using a second etching process.

Embodiments of the present disclosure have many advantages. The disclosed etching method performs a first etching process and a second etching in a same chamber. Since the wafer stays in the same chamber during the first and the second etching processes, processing is simplified and the process time may be advantageously reduced. The disclosed method reduces the dishing effect during etch back of the isolation structures, thereby improving effective fin height and reducing the capacitance of the formed semiconductor devices. Improved device performance is achieved. Better WAT test results are also achieved by the disclosed method.

In some embodiments, a method of manufacturing a semiconductor device includes forming a semiconductor strip protruding above a substrate, forming isolation regions on opposing sides of the semiconductor strip, recessing the isolation regions in a first chamber using a first etching process, and increasing a planarity of the isolation regions in the first chamber using a second etching process.

In another embodiment, a method of forming a fin field-effect transistor (FinFET) includes forming a first semiconductor strip and a second semiconductor strip over a substrate, forming isolation structures around the first semiconductor strip and the second semiconductor strip, and removing upper portions of the isolation structures. The removing includes performing a first etching process in a first chamber using a first etching gas, the first etching process removing upper portions of the isolation structures, and exposing upper portions of the first semiconductor strip and the second semiconductor strip, where after the first etching process, a first surface region of the isolation structures contacting the first semiconductor strip extends further away from the substrate than a second surface region of the isolation structures midway between the first semiconductor strip and the second semiconductor strip. The removing also includes performing a second etching process in the first chamber using a second etching gas different from the first etching gas, the second etching process reducing a distance between the first surface region and the second surface region measured along a first direction perpendicular to a major surface of the substrate.

In yet another embodiment, an etching system includes an etching chamber, a support in the etching chamber and configured to support a wafer disposed thereon, and a shower head in the etching chamber and configured to supply an inert gas into the etching chamber. The etching system also includes an inlet configured to be coupled to a gas supply and configured to supply reactant gases into the etching chamber, an outlet configured to be coupled to a pump and configured to remove gases from the etching chamber, and a controller configured to be coupled to the gas supply, the shower head, and the pump. The controller is configured to perform a first etching process by controlling the gas supply to supply a first etching gas into the etching chamber. The controller is also configured to perform a gas removal process after the first etching process by controlling the pump to remove gases from the etching chamber. The controller is further configured to perform a second etching process after the gas removal process by controlling the gas supply to supply a second etching gas different from the first etching gas into the etching chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device comprising:
  forming a semiconductor strip protruding above a substrate;
  forming isolation regions on opposing sides of the semiconductor strip;
  recessing the isolation regions in a first chamber using a first etching process, wherein after recessing the isolation region, a top portion of the semiconductor strip protrudes above a topmost surface of the recessed isolation region distal the substrate, wherein the topmost surface of the recessed isolation region has a first surface region contacting a sidewall of the semiconductor strip and has a second surface region away from the semiconductor strip, the first surface region extending further from the substrate than the second surface region; and
  after the first etching process, recessing the isolation regions further using a second etching process, wherein the second etching process has reduced etch selectivity between the first surface region and the second surface region as compared to the first etching process.

2. The method of claim 1, wherein the forming the isolation regions comprising forming the isolation regions using a flowable chemical vapor deposition (FCVD) process.

3. The method of claim 1, wherein the second etching process is performed using an etchant that provides $HF_2^-$ radicals.

4. The method of claim 1, wherein the first etching process uses an etching gas comprising NH3 and HF.

5. The method of claim 3, wherein the second etching process comprises an etching step, wherein the etching step uses an etching gas comprising HF and an anhydrous reactant.

6. The method of claim 5, wherein the anhydrous reactant is CH3OH or C2H5OH.

7. The method of claim 6, further comprising:
after the recessing with the first etching process and before the second etching process, pumping out gases in the first chamber.

8. The method of claim 7, wherein the etching step of the second etching process is performed under a pressure between about 1.5 torr and about 2 torr, and at a temperature between about 10° C. and about 20° C.

9. The method of claim 8, wherein the second etching process further comprises a water removal step, the water removal step comprises:
subjecting the semiconductor device to an inert gas having a temperature between about 120° C. to about 190° C.

10. The method of claim 9, wherein the inert gas comprises Ar, He, N2, or combinations thereof.

11. The method of claim 9, further comprising:
performing the etching step and the water removal step alternately until a pre-determined fin height is achieved.

12. The method of claim 11, wherein the first and second etching processes are performed for a duration between about 100 seconds and about 200 seconds.

13. A method of forming a fin field-effect transistor (FinFET) comprising:
forming a first semiconductor strip and a second semiconductor strip over a substrate;
forming isolation structures around the first semiconductor strip and the second semiconductor strip; and
removing upper portions of the isolation structures, the removing comprising:
performing a first etching process in a first chamber using a first etching gas, the first etching process removing upper portions of the isolation structures, and exposing upper portions of the first semiconductor strip and the second semiconductor strip, wherein after the first etching process, a first surface region of the isolation structures contacting the first semiconductor strip extends further away from the substrate than a second surface region of the isolation structures midway between the first semiconductor strip and the second semiconductor strip; and after performing the first etch process, performing a second etching process in the first chamber using a second etching gas different from the first etching gas, the second etching gas having a lower etch selectivity between the first surface region and the second surface region as compared to the first etching gas.

14. The method of claim 13, wherein the removing further comprises after the performing the first etching process and before the performing the second etching process, removing gases in the first chamber.

15. The method of claim 14, wherein the first etching gas comprises NH3 and HF, and the second etching gas comprises HF and at least one of CH3OH and C2H5OH.

16. The method of claim 15, wherein the second etching process comprises an etching step performed at a first temperature and a water removal step performed at a second temperature higher than the first temperature.

17. The method of claim 16, wherein the first temperature is between about 10° C. to about 20° C., and the second temperature is between about 120° C. to about 190° C.

18. A method of manufacturing a semiconductor device, the method comprising:
forming a fin protruding above a substrate;
forming isolation regions on opposing sides of the fin;
performing a first etching process to remove top portions of the isolation regions, wherein after the first etching process, a first portion of an upper surface of the isolation regions contacting the fin is further from the substrate than a second portion of the upper surface of the isolation region away from the fin;
performing an etching step using an etchant that has reduced etch selectivity between the first portion and the second portion of the upper surface of the isolation regions as compared to the first etching process and that also provides $HF_2^-$ radicals; and
performing a water removal step after the etching step.

19. The method of claim 18, wherein the first etching process uses an etchant that is different from the etchant of the etching step.

20. The method of claim 18, further comprising:
after the water removal step, performing another etching step using the etchant that provides the $HF_2^-$ radicals; and
performing another water removal step after the another etching step.

* * * * *